United States Patent [19]

Kominami

[11] 3,899,744

[45] Aug. 12, 1975

[54] TRANSISTOR AMPLIFIER CIRCUIT

[75] Inventor: Yasuo Kominami, Kokubunji, Japan

[73] Assignee: Hitachi, Ltd., Japan

[22] Filed: Feb. 7, 1974

[21] Appl. No.: 440,355

[30] Foreign Application Priority Data

Feb. 7, 1973 Japan ................................ 48-14660

[52] U.S. Cl. .................... 330/30 D; 330/18; 330/40

[51] Int. Cl.[2] ........................ H03F 3/45; H03F 3/68

[58] Field of Search..... 330/22, 30 D, 18, 28, 38 M, 330/40, 149

[56] References Cited

UNITED STATES PATENTS 3,532,909 10/1970 Buckley ............................ 330/40 X 3,538,449 11/1970 Solomon .................... 330/38 M UX 3,546,614 12/1970 Lochstampfer .................. 330/28 X

*Primary Examiner*—James B. Mullins

*Attorney, Agent, or Firm*—Craig & Antonelli

[57] ABSTRACT

In a transistor amplifier circuit having an amplifier transistor, a collector load resistance and an emitter resistance, a constant-current absorbing circuit is connected in parallel with the emitter resistance, and/or a constant current pressing-out circuit is connected in parallel with the collector load resistance, so that the distortion factor of the transistor amplifier circuit is lowered without spoiling the input dynamic range, the low supply voltage operation or the voltage amplification factor thereof.

1 Claim, 8 Drawing Figures

TRANSISTOR AMPLIFIER CIRCUIT

BACKGROUND OF THE INVENTION

1. Field of the Invention

The present invention relates to a transistor amplifier circuit. More particularly, it is directed to a transistor amplifier circuit having an improved distortion factor characteristic without employing negative feedback.

2. Description of the Prior Art

Acoustic equipment is generally required to have a low distortion factor. In a sound amplifier, for example, negative feedback, has hitherto been adopted for improvement of the distortion factor characteristic. In some cases, however, it is impossible to apply the negative feedback to the circuit. The present invention was motivated by the desire to reduce the distortion factor of an FM multiplex semiconductor integrated circuit (hereunder abbreviated to "FM MPX IC") of the coincidence system type which has been deemed to be the most excellent of demodulation systems for the FM stereophonic broadcast. The input signal of the FM MPX IC, which is a composite signal, is time-divided by a subcarrier of 38 KHz, and the divided signals are respectively taken out to the right and left channel outputs. It is, accordingly, meaningless in an FM MPX IC to subject the output signal to a negative feedback onto the input side, because the input signal and the output signal are quite different.

The inventor therefore has analyzed the cause of the distortion of the transistor circuit, and has developed an improvement which is intended to render the distortion factor low without use of negative feedback.

Taking as an example a conventional grounded-emitter transistor amplifier circuit, such as shown in FIG. 5, let us consider the distortion factor of the amplifier circuit.

The AC equivalent circuit of the grounded-emitter transistor amplifier circuit illustrated in FIG. 5 can be depicted as shown in FIG. 7(*a*). Now, when the resistances of bias resistors $R_1$ and $R_2$ are sufficiently large, they are negligible, and the AC equivalent circuit shown in FIG. 7(*a*) can be further simplified to one in FIG. 7(*b*). In the equivalent circuit diagrams, $i_b$ denotes the AC base current, $h_{fe}$ the AC current amplification factor, and $r_e$ the emitter junction resistance. The emitter junction resistance is a nonlinear resistance as understood from the base - emitter voltage ($V_{BE}$) - emitter current ($I_E$) characteristic *l* in FIG. 6.

The inventor considered that the emitter junction resistance $r_e$, being a nonlinear resistance, would be the cause of the distortion of the transistor amplifier circuit. The resistance $r_e$ is evaluated as in the following equation:

$$r_e = \delta V_{BE}/\delta I_E \quad (1)$$

Here, $V_{BE}$ is given from the diode rectification equation as follows:

$$V_{BE} = \frac{KT}{q} \ln \frac{I_E}{I_S} \quad (2)$$

From Equations (1) and (2), $$r_e = K\,T/(q\,I_E) \quad (3)$$

In these equations, K denotes the Boltzmann's constant, T the absolute temperature, q the electronic charge, and $I_S$ the emitter reverse saturation current.

Assuming that the THD (distortion factor) of the circuit is proportional to the ratio of (the nonlinear input impedance)/(the total impedance), the distortion factor becomes:

$$THD = (1 + h_{fe})\, r_e/\{(1 + h_{fe})\,(r_e + R_E)\} = r_e/(r_e + R_E) \fallingdotseq r_e/R_E \; (r_e << R_E) \quad (4)$$

From Equation (3), $$THD \fallingdotseq K\,T/(q\,I_E\,R_E) \quad (5)$$

On the other hand, the emitter resistance $R_E$ as well as the emitter current $I_E$ and the base - emitter voltage $V_{BE}$ have the following relation to the base DC bias voltage $V_B$:

$$V_B = V_{BE} + R_E\,I_E \text{ therefor, } I_E = (V_B - V_{BE})/R_E \quad (6)$$

Substituting Equation (6) into Equation (5), $$THD \fallingdotseq (K\,T/q\,R_E)\,\{R_E/(V_B - V_{BE})\} = K\,T/\{q(V_B - V_{BE})\} \quad (7)$$

Accordingly, the distortion factor becomes independent of the emitter resistance $R_E$ and the emitter current $I_E$, and depends on the transistor base DC voltage $V_B$.

Therefore, in order to lower the distortion factor of the transistor amplifier circuit shown in FIG. 5, the base DC voltage $V_B$ may be raised. When, however, the base DC voltage is raised, the emitter current $I_E$ increases, and the DC voltage drop across a load resistance $R_L$ becomes large. As a result, the DC collector voltage of the transistor $Q_1$ becomes prone to saturation, and the dynamic range becomes narrow.

In order to prevent this inconvenience, it is required to make the supply voltage $V_{CC}$ high or to make the resistance of the load resistor $R_L$ low. This is consistent with the generally known method for reducing the distortion factor of any transistor amplifier circuit, and the hypothesis previously stated holds.

Thus, where it is intended to improve the distortion factor characteristic without utilizing negative feedback, the prior art sacrifices either the low supply voltage operation or the voltage amplification factor.

SUMMARY OF THE INVENTION

It is therefore an object of the present invention to improve the distortion factor characteristic of a transistor amplifier circuit without employing negative feedback and without sacrificing the input dynamic range, the low supply voltage operation or the voltage amplification factor.

The fundamental construction of the present invention for accomplishing the above object is characterized in that at least an amplifier transistor, a collector load resistance and an emitter resistance are provided, and that a constant-current circuit is connected in parallel with the emitter resistance or the collector load resistance.

BRIEF DESCRIPTION OF THE DRAWINGS

FIGS. 1 to 4 are schematic circuit diagrams each showing an embodiment of the present invention, in which FIG. 1 illustrates a grounded-emitter transistor amplifier circuit with a constant-current absorbing circuit added thereto;

FIG. 2 illustrates a grounded-emitter transistor amplifier circuit with a constant-current pressing-out circuit added thereto;

FIG. 3 illustrates a grounded-emitter transistor amplifier circuit with a constant-current absorbing circuit and the constant-current pressing-out circuit added thereto;

FIG. 4 illustrates an FM multiplex circuit with a constant-current abosrbing circuit and a constant-current pressing-out circuit added thereto;

PREFERRED EMBODIMENTS OF THE INVENTION

EMBODIMENT 1

Figure 1:
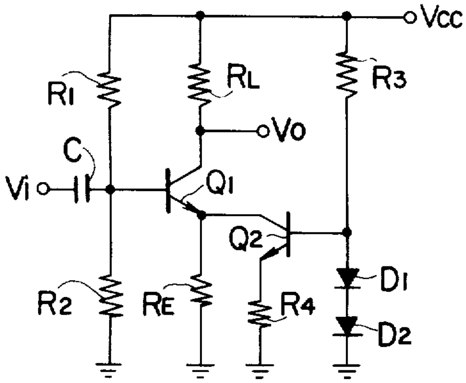

As illustrated in FIG. 1, in a transistor amplifier circuit which includes an amplifier transistor $Q_1$, a collector load resistance $R_L$, an emitter resistance $R_E$, bias resistances $R_1$ and $R_2$ and an input capacitor C, and which has an input terminal $V_i$ and an output terminal $V_o$, a constant-current absorbing circuit is connected in parallel with the emitter resistance $R_E$. The constant-current absorbing circuit is constructed of a constant-current transistor $Q_2$, and bias means consisting of diodes $D_1$ and $D_2$ and resistances $R_3$ and $R_4$ and for causing a constant current to flow through the transistor $Q_2$.

With the above construction, the constant-current absorbing circuit is added to the emitter resistance $R_E$, whereby the constant current $I_o$ flowing through the transistor $Q_2$ of the constant-current circuit bypasses the emitter resistance $R_E$. Letting I designate the current flowing through the emitter resistance, $$I_E = I_o + I_{RE} \tag{8}$$

On the other hand, the base DC voltage $V_B$ is given by:

$$V_B = V_{BE} + R_E\, I_{RE} = V_{BE} + R_E\,(I_E - I_o) \tag{9}$$

$$\text{therefor } I_E = (R_E\, I_o + V_B - V_{BE})/R_E$$

Accordingly, from Equation (5), the distortion factor becomes:

$$\begin{aligned} THD &= K\,T/Cq\, I_E\, R_E) \\ &= (K\,T/q\,R_E).\{R_E/\{R_E\, I_o + (V_B - V_{BE})\}\} \\ &= K\,T/[\,q\{R_E\, I_o + (V_B - V_{BE})\}\,] \end{aligned} \tag{10}$$

Thus, at the same supply voltage $V_{CC}$, load resistance $R_L$ and DC bias voltage $V_B$, the circuit of the embodiment can attain a lowering of the distortion factor as indicated in Equation (10) in comparison with the foregoing case of Equation (7).

EMBODIMENT 2

Figure 2:
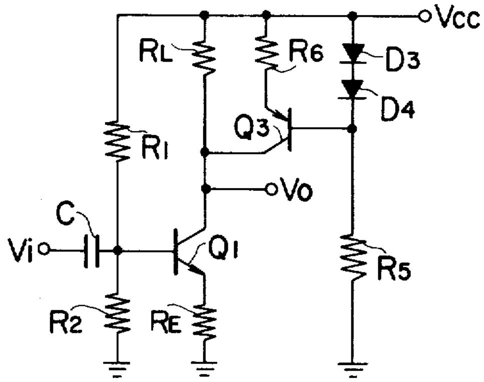

As illustrated in FIG. 2, in the fundamental arrangement of the transistor amplifier circuit in Embodiment 1, the current path of a constant-current pressing-out circuit is connected in parallel with the collector load resistance $R_L$ of the amplifier circuit. The constant-current pressing-out circuit is constructed of a constant-current transistor $Q_3$, and bias means consisting of diodes $D_3$ and $D_4$ and resistances $R_5$ and $R_6$, for causing a constant current to flow through the transistor $Q_3$.

With the above construction, the emitter current $I_E$ becomes:

$$I_E = (V_B - V_{BE})/R_E = I_o + I_{RL} \tag{11}$$

where $I_{RL}$ denotes the current flowing through the collector load resistance $R_L$, and $I_o$ the current of the constant-current pressing-out circuit.

On the other hand, the distortion factor is given by Equation (7) as $$THD = K\,T/\{q\,(V_B - V_{BE})\} \tag{7}$$

Thus, even when the bias voltage $V_B$ is raised in order to improve the distortion factor THD and consequently the emitter current $I_E$ increases, the rise of the voltage drop across the collector load resistance $R_L$ does not come into equestion because, owing to the transistor $Q_3$ of the constant-current pressing-out circuit, the constant current $I_o$ bypasses the collector load resistance $R_L$ to flow into the amplifier transistor $Q_1$.

EMBODIMENT 3

Figure 3:
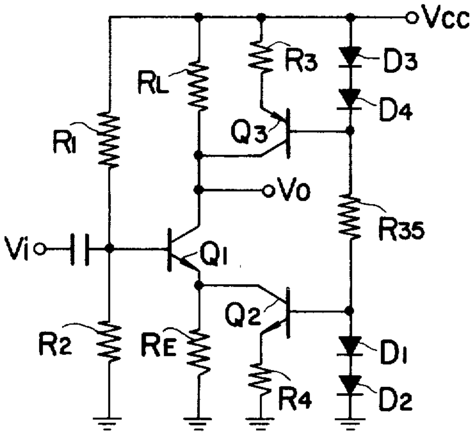

As illustrated in FIG. 3, both the constant-current absorbing and pressing-out circuits according to the previous two embodiments are added to the transistor amplifier circuit.

According to the present invention described above in connection with the preferred embodiments, its object can be accomplished and its effect can be brought forth on the ground stated below.

As previously explained, in order to improve the distortion factor of the transistor amplifier circuit without employing negative feedback, the emitter resistance $R_E$ may be made large, as apparent from Equation (4) (the base DC voltage may be increased as apparent from Equation (7) ). With the prior art circuit, however, the DC collector voltage of the amplifier transistor $Q_1$ becomes easily saturated, and the dynamic range becomes narrow. In accordance with the present invention, in the case of Embodiment 1, even when the emitter resistance $R_E$ is made large, the current $I_E$ flowing through the emitter resistance $R_E$ is not made large owing to the presence of the constant-current absorbing circuit. Therefore, neither the input dynamic range, the low supply voltage operation nor the voltage amplification factor is sacrificed.

In the case of Embodiment 2, even when the base DC bias voltage $V_B$ of the amplifier transistor $Q_1$ is made large to improve the distortion factor, the current $I_{RL}$ flowing through the collector load resistance $R_L$ does not become large through the emitter current $I_E$ increases and owing to the presence of the constant-current pressing-out circuit. Accordingly, within the input dynamic range, the low supply voltage operation nor the voltage amplification factor is sacrificed.

Consequently, in the case of Embodiment 3, the DC bias voltage $V_B$ can be raised, and therewith, the emitter resistance $R_E$ can be increased. Therefore, the distortion factor can be more improved without sacrificing the input dynamic range, the low supply voltage operation or the voltage amplification factor.

The present invention can have the following aspects of performance in addition to the following embodiments.

Figure 4:
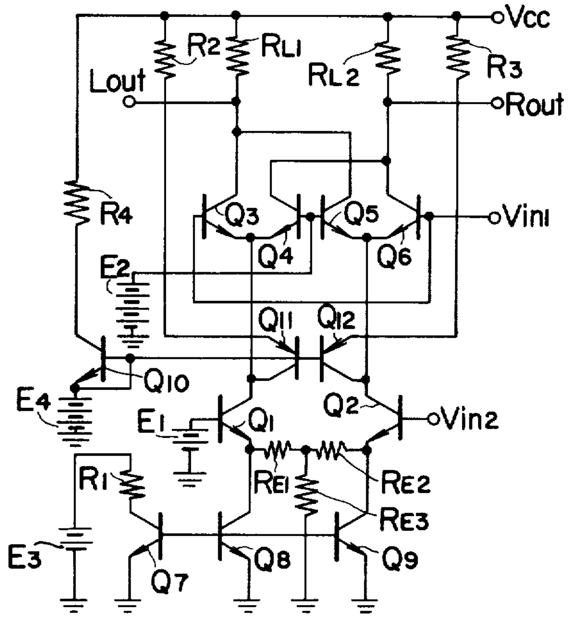
Figure 5:
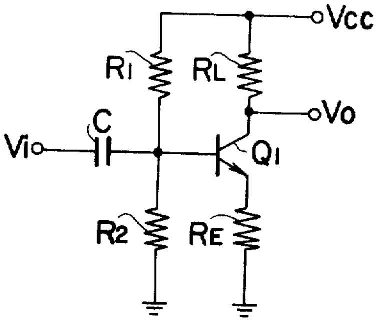
FIG. 5 is a schematic circuit diagram of a prior-art grounded-emitter transistor amplifier circuit.
Figure 6:
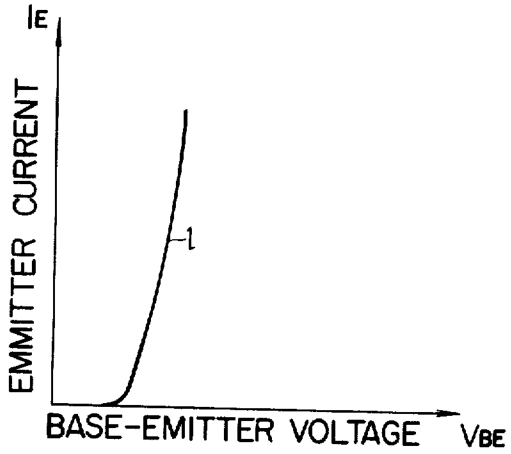
FIG. 6 is a diagram of the emitter current ($I_E$)-base-emitter voltage ($V_{BE}$) characteristic curve of a transistor circuit.
Figure 7A:
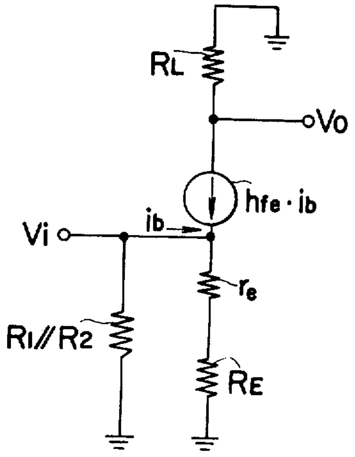
FIGS. 7(*a*) and 7(*b*) are diagrams of the equivalent circuits of the grounded-emitter transistor amplifier circuit as shown in FIG. 5.
Figure 7B:
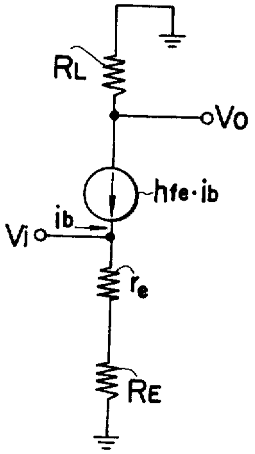

FIG. 4 shows an embodiment in which the present invention is applied to an FM MPX circuit. In the FM MPX circuit composed of differential amplifier circuits, a constant-current pressing-out circuit ($Q_{10}$, $Q_{11}$, $Q_{12}$, $R_2$, $R_3$, $R_4$) is connected in parallel with load resistances $R_{L1}$ and $R_{L2}$ for producing the respective outputs ($R_{out}$, $L_{out}$) of right and left channels, while a constant-current absorbing circuit ($Q_7$, $Q_8$, $Q_9$, $R_1$) is connected in parallel with an emitter resistance circuit ($R_{E1}$, $R_{E2}$, $R_{E3}$). The constant-current pressing-out circuit constituted of the transistors $Q_{10}$ - $Q_{12}$ may also be connected to the collectors of transistors $Q_3$ and $Q_6$. Thus, for the same reasons as in the previous explanation, it becomes possible to realize a low distortion factor in signal circuits in which the negative feedback has been avoided, and the aforesaid object can be achieved.

As regards the constant-current absorbing circuit and the constant-current pressing-out circuit, it is a matter of course that any forms of the circuit arrangements can be adopted insofar as they are means to absorb and press out a substantially constant current independent of signals by bypassing the emitter resistance $R_E$ and the collector load resistance $R_L$, respectively.

The present invention is applicable to a transistor signal circuit having at least an emitter resistance or a collector load resistance.

What is claimed is:

1. A transistor amplifier circuit comprising:

first to sixth transistors, each having an emitter, a base and a collector;

a first resistor, one end of which is connected to the emitter of said first transistor;

a second resistor, one end of which is connected to the emitter of said second transistor;

a third resistor, one end of which is connected to ground;

means for connecting the other ends of said first to third resistors in common;

means for connecting the emitters of said third and fourth transistors with the collector of said first transistor;

means for connecting the emitters of said fifth and sixth transistors with the collector of said second transistor;

means for connecting the base of the third transistor with the base of the sixth transistor;

means for connecting the base of the fourth transistor with the base of the fifth transistor;

a fourth resistor, one end of which is connected to the collectors of said third and fifth transistors;

a fifth resistor, one end of which is connected to the collectors of said fourth and sixth transistors;

means for connecting the other ends of said fourth and sixth resistors with a first voltage source;

means for connecting the base of said first transistor with a second voltage source;

means for connecting the bases of said fourth and fifth transistors with a third voltage source;

first input means for applying a first input signal to the base of said sixth transistor;

second input means for applying a second input signal to the base of said second transistor;

a first constant current circuit connected between the emitter of said first transistor and ground;

a second constant current circuit connected between the emitter of said second transistor and ground;

a third constant current circuit connected between the collector of said first transistor and said first voltage source; and a fourth constant current circuit connected between the collector of said second transistor and said first voltage source.

* * * * *